(12) United States Patent
Otsuji

(10) Patent No.: US 11,036,139 B2
(45) Date of Patent: Jun. 15, 2021

(54) SACRIFICIAL FILM FORMING METHOD, SUBSTRATE TREATMENT METHOD, AND SUBSTRATE TREATMENT DEVICE

(71) Applicant: SCREEN Holdings Co., Ltd., Kyoto (JP)

(72) Inventor: Masayuki Otsuji, Kyoto (JP)

(73) Assignee: SCREEN Holdings Co., Ltd.

( * ) Notice: Subject to any disclaimer, the term of this patent is extended or adjusted under 35 U.S.C. 154(b) by 106 days.

(21) Appl. No.: 16/317,233

(22) PCT Filed: Aug. 22, 2017

(86) PCT No.: PCT/JP2017/029993
§ 371 (c)(1),
(2) Date: Jan. 11, 2019

(87) PCT Pub. No.: WO2018/047615
PCT Pub. Date: Mar. 15, 2018

(65) Prior Publication Data
US 2019/0258166 A1     Aug. 22, 2019

(30) Foreign Application Priority Data

Sep. 12, 2016  (JP) .............................. JP2016-177884

(51) Int. Cl.
| | | |
|---|---|---|
| *G03F 7/16* | (2006.01) | |
| *H01L 21/67* | (2006.01) | |
| *H01L 21/304* | (2006.01) | |
| *H01L 21/687* | (2006.01) | |

(52) U.S. Cl.
CPC .............. *G03F 7/168* (2013.01); *G03F 7/162* (2013.01); *H01L 21/304* (2013.01);
(Continued)

(58) Field of Classification Search
CPC ................................. G03F 7/162; G03F 7/168
See application file for complete search history.

(56) References Cited

U.S. PATENT DOCUMENTS 6,165,552 A * 12/2000 Anai .................. B01D 19/0005
427/240
7,632,434 B2 * 12/2009 Duescher ............. C09K 3/1436
264/11
(Continued)

FOREIGN PATENT DOCUMENTS

| JP | 2009-218376 A | 9/2009 |
|---|---|---|
| JP | 2011-124313 A | 6/2011 |

(Continued)

OTHER PUBLICATIONS

International Search Report dated Nov. 7, 2017 in corresponding PCT International Application No. PCT/JP2017/029993.
(Continued)

*Primary Examiner* — Nathan H Empie
(74) *Attorney, Agent, or Firm* — Ostrolenk Faber LLP

(57) ABSTRACT

In a method of forming a sacrificial film, a liquid film 26 of a sacrificial polymer solution 25 which covers the front surface of a substrate W in which patterns P are formed is heated from the side of the substrate, the solution in contact with the front surface of the substrate is evaporated and thus the liquid film is dried in a state where the liquid film is held on at least tip end portions other than base portions of the patterns, with the result that a sacrificial film is formed. In a substrate processing method and a substrate processing apparatus, the front surface of the substrate is processed while the collapse of the patterns is suppressed or prevented by utilization of the formed sacrificial film.

8 Claims, 7 Drawing Sheets

(52) U.S. Cl.
CPC .... *H01L 21/6715* (2013.01); *H01L 21/67028* (2013.01); *H01L 21/67034* (2013.01); *H01L 21/67051* (2013.01); *H01L 21/67103* (2013.01); *H01L 21/68742* (2013.01)

(56) References Cited

U.S. PATENT DOCUMENTS

| | | | | |
|---|---|---|---|---|
| 8,821,974 | B2 | 9/2014 | Kimura et al. | 427/248.1 |
| 2007/0059213 | A1* | 3/2007 | Aizenberg | B01F 13/0079 |
| | | | | 422/400 |
| 2013/0008868 | A1 | 1/2013 | Uozumi et al. | 216/41 |
| 2014/0273509 | A1* | 9/2014 | Wang | H01L 21/0273 |
| | | | | 438/760 |
| 2014/0356790 | A1 | 12/2014 | Hirano et al. | 430/286.1 |
| 2014/0373384 | A1* | 12/2014 | Sirard | H01L 21/02082 |
| | | | | 34/357 |
| 2016/0254162 | A1 | 9/2016 | Okutani et al. | |
| 2017/0218227 | A1 | 8/2017 | Nakasugi et al. | |

FOREIGN PATENT DOCUMENTS

| | | |
|---|---|---|
| JP | 2013-016699 A | 1/2013 |
| JP | 2014-110404 A | 6/2014 |
| JP | 5662081 B2 | 1/2015 |
| JP | 2015-088619 A | 5/2015 |
| JP | 5771035 B2 | 8/2015 |
| TW | 201612240 A | 4/2016 |
| TW | I534069 B | 5/2016 |

OTHER PUBLICATIONS

Written Opinion dated Nov. 7, 2017 in corresponding PCT International Application No. PCT/JP2017/029993.
International Preliminary Report on Patentability (Chapter I) dated Mar. 21, 2019 with Notification from the International Bureau (Form PCT/IB/326) in corresponding PCT International Application No. PCT/JP2017/029993 in Japanese.
International Preliminary Report on Patentability (Chapter I) dated Mar. 21, 2019 with Notification from the International Bureau (Form PCT/IB/338) in corresponding PCT International Application No. PCT/JP2017/029993 in English.
Second and Supplementary Notice Informing the Application to the Application of th International Application (to designated offices which apply the 30 month time limit under Article 22(1)) (Form PCT/IB/308) in corresponding PCT International Application No. PCT/JP2017/029993.

* cited by examiner

SACRIFICIAL FILM FORMING METHOD, SUBSTRATE TREATMENT METHOD, AND SUBSTRATE TREATMENT DEVICE

CROSS-REFERENCE TO RELATED APPLICATIONS

The present application is a 35 U.S.C. §§ 371 national phase conversion of PCT/JP2017/029993, filed Aug. 22, 2017, which claims priority to Japanese Patent Application No. 2016-177884, filed Sep. 12, 2016, the contents of both of which are incorporated herein by reference. The PCT International Application was published in the Japanese language.

TECHNICAL FIELD

The present invention relates to a sacrificial film formation method, a substrate processing method and a substrate processing apparatus. Examples of substrates to be processed include semiconductor wafers, substrates for liquid crystal display devices, substrates for plasma displays, substrates for FEDs (Field Emission Displays), substrates for optical disks, substrates for magnetic disks, substrates for magneto-optical disks, substrates for photomasks, ceramic substrates and substrates for solar cells.

BACKGROUND ART

In a process of manufacturing a semiconductor device, the front surface of a substrate such as a semiconductor wafer is processed with various types of processing liquids including a chemical liquid and a rinse liquid.

For example, a single substrate processing type substrate processing apparatus that processes substrates one by one includes a spin chuck which rotates a substrate while holding the substrate substantially horizontally and a nozzle which supplies a processing liquid to the upper surface of the substrate that is rotated by the spin chuck.

In a typical substrate processing step, a chemical liquid is supplied to a substrate which is held by a spin chuck, thereafter a rinse liquid is supplied and thus the chemical liquid on the substrate is replaced by the rinse liquid. A general rinse liquid is deionized water.

Thereafter, in order to remove the rinse liquid on the substrate, a drying step is performed. As the drying step, a spin drying step of rotating the substrate at a high speed so as to perform spinning-off drying is known.

However, in the drying step, patterns such as a convex pattern and a linear pattern which are formed on the front surface of the substrate may collapse due to the surface tension of the rinse liquid and the like.

Hence, in order to suppress or prevent the collapse of patterns, a method is known in which a rinse liquid on a substrate is replaced by a low surface tension liquid such as IPA (isopropyl alcohol) such that the substrate is dried (see Patent Literatures 1 and 2 and the like).

CITATION LIST

Patent Literature

Patent Literature 1: Japanese Patent Application Publication No. 2009-218376
Patent Literature 2: Japanese Patent Application Publication No. 2014-110404

SUMMARY OF INVENTION

Technical Problem

However, even if the rinse liquid on the substrate is replaced by the low surface tension liquid such that the substrate is dried, it is still likely that the patterns easily collapse. For example, the patterns easily collapse when the pattern is fine and has a high aspect ratio or when the pattern is formed with a multilayer member of various films and the materials of the films differ from each other in surface free energy.

For example, a sacrificial polymer is charged between the patterns without any gap so as to form a sacrificial layer, and thus it is possible to prevent the collapse of the patterns. For example, the sacrificial layer can be formed by replacing the rinse liquid on the substrate with a solution of the sacrificial polymer and then performing drying.

However, in order to form the sacrificial layer which completely fills the gaps between the patterns, a large amount of sacrificial polymer is needed. Therefore, it is difficult to completely remove, from the front surface of the substrate, the sacrificial layer formed of a large amount of sacrificial polymer, and thus a large amount of residue is produced.

Hence, in particular, in a drying step after rinsing which is the final stage of substrate processing, it is necessary to avoid, as much as possible, the re-formation of the sacrificial layer which may cause the production of a large amount of residue.

Hence, an object of the present invention is to provide a method of forming a sacrificial film which can suppress or prevent the collapse of patterns while reducing the amount of sacrificial polymer used and a substrate processing method and a substrate processing apparatus which utilize the sacrificial film formation method.

Solution to Problem

This invention provides a sacrificial film formation method which is a method of forming a sacrificial film on at least a tip end portion other than a base portion of a pattern formed on the front surface of a substrate, and the method includes a substrate holding step of holding the substrate horizontally in a state where the front surface is directed upward, a liquid film formation step of supplying a solution of a sacrificial polymer to the front surface of the substrate so as to form a liquid film which covers the front surface of the substrate, a liquid film holding step of heating the substrate so as to evaporate the solution in contact with the front surface of the substrate such that the liquid film is held on at least the tip end portion other than the base portion of the pattern and a drying step of drying the liquid film which is held.

In this method, the liquid film covering the front surface of the substrate is heated from the side of the substrate, and thus by a so-called Leidenfrost phenomenon, the substrate can be dried in a state where the liquid film is held on at least the tip end portions other than the base portions of the patterns. In other words, in particular, the region including at least the tip end portions which are easily brought into contact with each other in the patterns formed on the front surface of the substrate can be selectively covered by the sacrificial film formed of a small amount of sacrificial polymer as compared with the conventional method.

Hence, while the amount of sacrificial polymer used is being reduced, the patterns are protected by the sacrificial film, and thus for example, the collapse of the patterns can be suppressed or prevented. Specifically, a bridge of the sacrificial film which connects the tip end portions of the adjacent patterns is formed, and thus the collapse of the individual patterns can be suppressed or prevented, or the tip end portions of the individual patterns are individually covered, and thus the collapse of the patterns can be suppressed or prevented by contact between the sacrificial films. The base portions of the patterns are exposed without being covered by the sacrificial film. Hence, after the formation of the sacrificial film, for example, the base positions of the patterns which are exposed can be processed with the processing liquid and the like.

Preferably, the drying step includes a step of heating the substrate.

In particular, the substrate is continuously heated from the liquid film holding step, and thus it is possible to efficiently form the sacrificial film in a short period of time.

This invention provides a substrate processing method which includes a processing liquid supply step of supplying a processing liquid to the substrate, a spin drying step of rotating, after the processing liquid supply step, the substrate at a high speed so as to perform spinning-off drying and a sacrificial film formation step which is performed before the processing liquid supply step and which uses the sacrificial film formation method so as to form a sacrificial film on at least the tip end portion other than the base portion of the pattern formed on the front surface of the substrate.

In this method, in a state where the sacrificial film is previously formed on at least the tip end portions other than the base portions of the patterns by the sacrificial film formation method described previously, the processing liquid supply step and the spin drying step are performed. The base portions of the patterns are exposed without being covered by the sacrificial film. Hence, while in the spin drying step, the collapse of the patterns is suppressed or prevented by the sacrificial film, in the processing liquid supply step preceding the spin drying step, the base portions of the patterns which are exposed without being covered by the sacrificial film can be processed with the processing liquid.

This invention provides a substrate processing apparatus that includes a substrate holding unit which holds a substrate horizontally in a liquid processing position and a sacrificial film formation position, a rotation unit which rotates the substrate in the liquid processing position and the sacrificial film formation position about a rotation axis passing through a center portion of the substrate, a processing liquid supply unit which supplies, in the liquid processing position, a processing liquid to the upper surface of the substrate, a sacrificial polymer solution supply unit which supplies, in the sacrificial film formation position, a solution of a sacrificial polymer to the upper surface of the substrate, a heating unit which heats the substrate in the sacrificial film formation position and a controller which controls the rotation unit, the processing liquid supply unit, the sacrificial polymer solution supply unit and the heating unit, and the controller performs a processing liquid supply step of supplying a processing liquid to the substrate, a spin drying step of rotating, after the processing liquid supply step, the substrate at a high speed so as to perform spinning-off drying and a sacrificial film formation step which is performed before the processing liquid supply step and which uses the sacrificial film formation method so as to form a sacrificial film on at least the tip end portion other than the base portion of the pattern formed on the upper surface of the substrate.

In this arrangement, the liquid film covering the front surface of the substrate is heated from the side of the substrate, and thus by the so-called Leidenfrost phenomenon, the substrate can be dried in a state where the liquid film is held on at least the tip end portions other than the base portions of the patterns. In other words, in particular, the region including at least the tip end portions which are easily brought into contact with each other in the patterns formed on the front surface of the substrate can be selectively covered by the sacrificial film formed of a small amount of sacrificial polymer as compared with the conventional method.

Hence, while the amount of sacrificial polymer used is being reduced, the patterns are protected by the sacrificial film, and thus the collapse of the patterns can be suppressed or prevented. Specifically, a bridge of the sacrificial film which connects the tip end portions of the adjacent patterns is formed, and thus the collapse of the individual patterns can be suppressed or prevented, or the tip end portions of the individual patterns are individually covered, and thus the collapse of the patterns can be suppressed or prevented by contact between the sacrificial films.

Moreover, in a state where the sacrificial film is previously formed on at least the tip end portions other than the base portions of the patterns, the processing liquid supply step and the spin drying step are performed. The base portions of the patterns are exposed without being covered by the sacrificial film. Hence, while in the spin drying step, the collapse of the patterns is suppressed or prevented by the sacrificial film, in the processing liquid supply step preceding the spin drying step, the base portions of the patterns which are exposed without being covered by the sacrificial film can be processed with the processing liquid.

DESCRIPTION OF EMBODIMENTS

Figure 1:
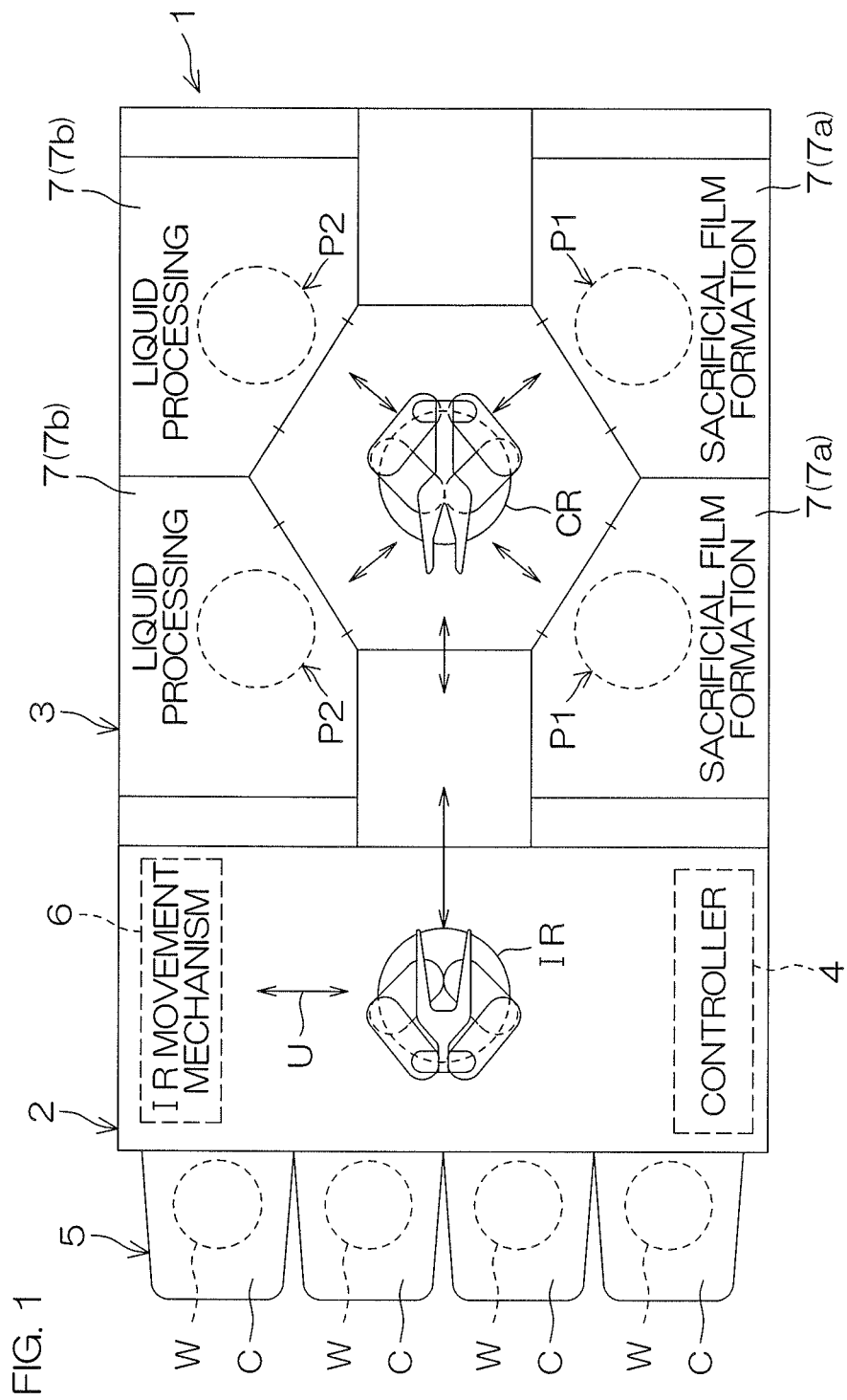
FIG. 1 is a schematic plan view showing the layout of a substrate processing apparatus according to a preferred embodiment of this invention.

FIG. 1 is a schematic plan view showing the layout of a substrate processing apparatus 1 according to a preferred embodiment of this invention.

The substrate processing apparatus 1 is a single substrate processing type substrate processing apparatus which processes, one by one, disk-shaped substrates W such as semiconductor wafers with processing liquids including a chemical liquid and a rinse liquid. In the substrate W to be processed by the substrate processing apparatus 1, patterns are formed on the front surface. The substrate processing apparatus 1 includes an indexer block 2, a processing block 3 which is coupled to the indexer block 2 and a controller 4 which controls the operations of devices included in the substrate processing apparatus 1 and the opening and closing of valves. The controller 4 is formed with, for example, a microcomputer. The controller 4 includes an arithmetic unit such as a CPU, a storage unit such as a fixed memory device, a hard disk drive, etc., and an input/output unit. In the storage unit, recipes (programs which are executed by the arithmetic unit) for performing substrate processing are stored.

The indexer block 2 includes a carrier holding portion 5, an indexer robot IR and an IR movement mechanism 6. The carrier holding portion 5 holds carriers C which can store a plurality of substrates W. A plurality of carriers C are held by the carrier holding portion 5 in a state where they are aligned in a horizontal carrier alignment direction U. The IR movement mechanism 6 moves the indexer robot IR in the carrier aligned direction U. The indexer robot IR performs a carry-in operation of carrying a substrate W into the carrier C held by the carrier holding portion 5 and a carry-out operation of carrying the substrate W out from the carrier C.

On the other hand, the processing block 3 includes a plurality of (for example, four or more) processing units 7 which process the substrate W and a center robot CR. The processing units 7 are arranged so as to surround the center robot CR in plan view. The processing units 7 include a sacrificial film forming unit 7a which forms a sacrificial film on at least tip end portions of patterns other than base portions that are formed on the front surface of the substrate W and a liquid processing unit 7b which supplies a processing liquid to the front surface of the substrate W so as to process the substrate W with the processing liquid.

The center robot CR performs a carry-in operation of carrying the substrate W into the processing unit 7, a carry-out operation of carrying the substrate W out from the processing unit 7 and a transfer operation of transferring the substrate W between the processing units 7. Furthermore, the center robot CR performs an operation of receiving the substrate W from the indexer robot IR and an operation of passing the substrate W to the indexer robot IR.

The indexer robot IR and the center robot CR are controlled by the controller 4.

Figure 2:
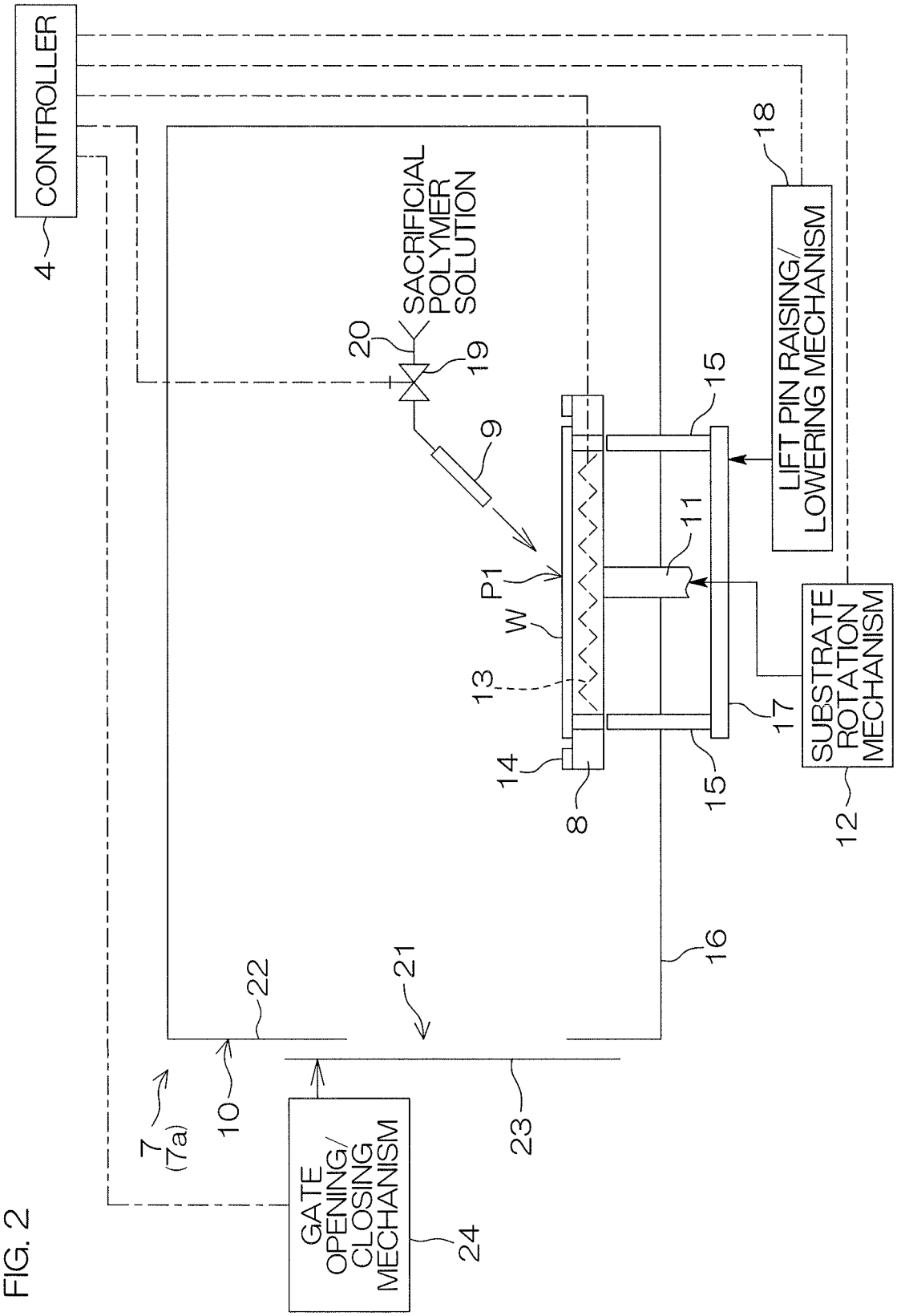
FIG. 2 is a schematic view showing a schematic arrangement of a sacrificial film forming unit included in the substrate processing apparatus.
Figure 3A:
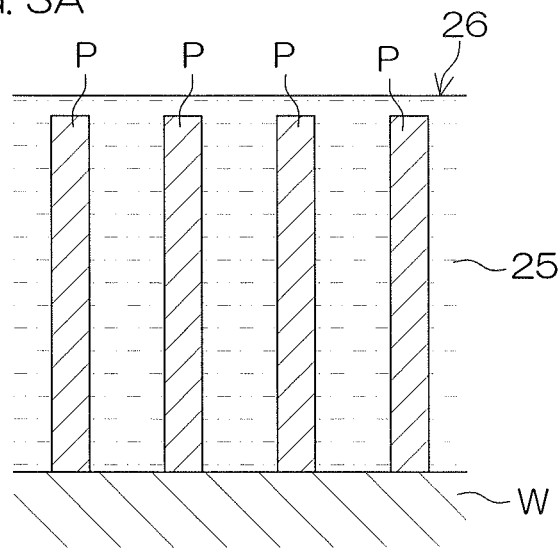
FIG. 3A is a schematic cross-sectional view for illustrating a liquid film formation step in a sacrificial film formation step which is performed in the sacrificial film forming unit.
Figure 3B:
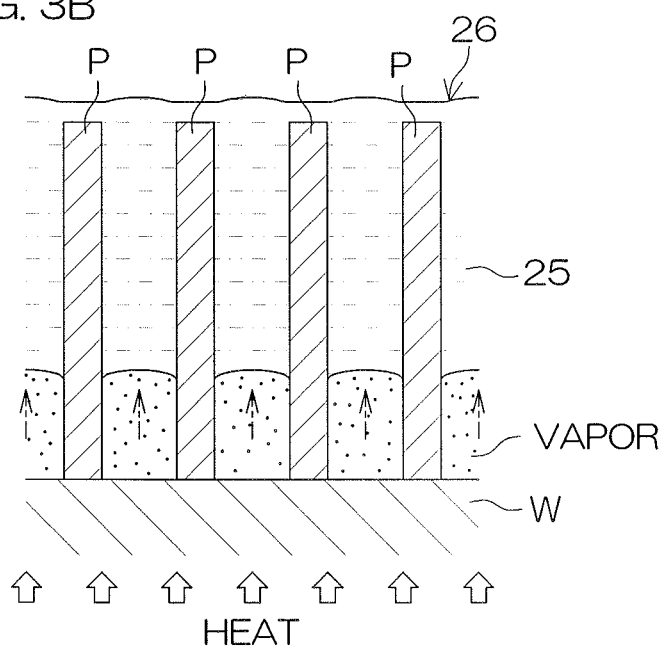
FIG. 3B is a schematic cross-sectional view for illustrating a liquid film holding step in the sacrificial film formation step.
Figure 3C:
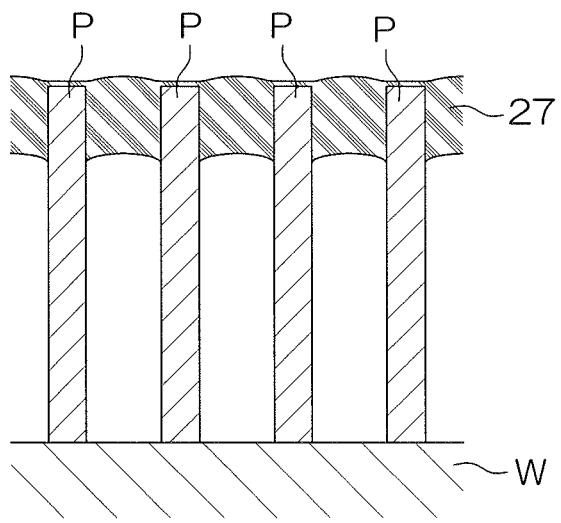
FIG. 3C is a schematic cross-sectional view of an example of a sacrificial film which is formed through a drying step in the sacrificial film formation step.
Figure 3D:
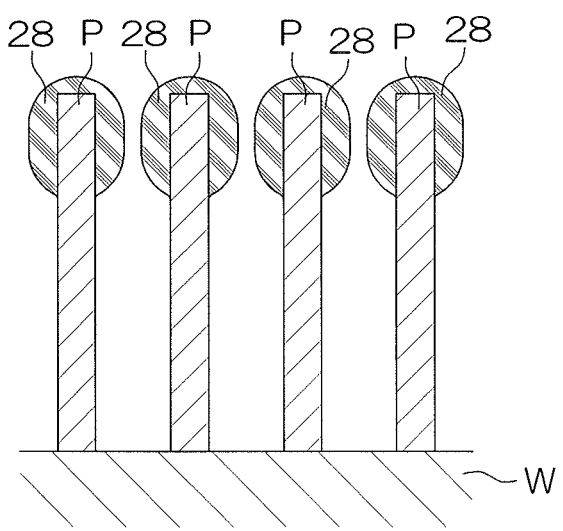
FIG. 3D is a schematic cross-sectional view of another example of the sacrificial film.

FIG. 2 is a schematic view showing a schematic arrangement of the sacrificial film forming unit 7a included in the substrate processing apparatus 1. In the following discussion, the schematic arrangement of the sacrificial film forming unit 7a and an example of processing of the substrate W which is performed in the sacrificial film forming unit 7a will be described. The schematic arrangement of the sacrificial film forming unit 7a will first be described.

The sacrificial film forming unit 7a includes a substrate holding base 8 (substrate holding unit) which holds the substrate W horizontally and rotates it, a sacrificial polymer solution nozzle 9 which supplies a solution of a sacrificial polymer (sacrificial polymer solution) to the upper surface of the substrate W held on the substrate holding base 8 and a chamber 10 which stores the substrate holding base 8 and the sacrificial polymer solution nozzle 9.

The substrate holding base 8 is fixed to the upper end of a rotation shaft 11 which extends in a vertical direction. A substrate rotation mechanism 12 (rotation unit) which rotates the rotation shaft 11 about the center axis of the rotation shaft 11 is coupled to the rotation shaft 11. The substrate rotation mechanism 12 is, for example, a mechanism which includes a motor. Within the substrate holding base 8, a heater 13 (heating unit) which heats the substrate W held on the substrate holding base 8 is embedded. Furthermore, on the substrate holding base 8, a soaking ring 14 is provided which uniformizes the temperature of the substrate W when heating is performed with the heater 13. The soaking ring 14 is formed in the shape of a ring which surrounds a holding position P1 of the substrate W on the substrate holding base 8. The holding position P1 is a sacrificial film formation position.

In relation to the substrate holding base 8, a plurality of (for example, three) lift pins 15 are provided which raise and lower the substrate W with respect to the substrate holding base 8. The lift pins 15 are inserted through a bottom wall 16 of the chamber 10 and are supported on a common support member 17 outside the chamber 10. A lift pin raising/lowering mechanism 18 including a cylinder is coupled to the support member 17. The lift pin raising/lowering mechanism 18 raises and lowers the lift pins 15 together between a position in which the tip ends of the lift pins 15 are protruded upward of the substrate holding base 8 and a position in which the tip ends of the lift pins 15 are retracted downward of the substrate holding base 8.

The sacrificial polymer solution nozzle 9 is connected to a sacrificial polymer solution supply pipe 20 (sacrificial polymer solution supply unit) in which a sacrificial polymer solution valve 19 is interposed. The supply of the sacrificial polymer solution to the sacrificial polymer solution nozzle 9 is controlled by the opening and closing of the sacrificial polymer solution valve 19. The sacrificial polymer solution supplied to the sacrificial polymer solution nozzle 9 is discharged toward a center portion of the upper surface of the substrate W held on the substrate holding base 8.

As the sacrificial polymer solution, for example, a solution is mentioned which is obtained by dissolving a conventional sacrificial polymer that forms a sacrificial layer containing an acrylic resin, a novolak resin or the like in a solvent such as water or IPA at an arbitrary concentration.

The chamber 10 includes a partition wall 22 in which an opening 21 for carrying the substrate W into and out of the chamber 10 is formed and a gate shutter 23 which covers the opening 21. The gate shutter 23 is arranged outside the partition wall 22. A gate opening/closing mechanism 24 including a cylinder is coupled to the gate shutter 23. The gate opening/closing mechanism 24 moves the gate shutter 23 between a closing position in which the gate shutter 23 is closely adhered to the outer surface of the partition wall 22 so as to tightly close the opening 21 and an opening position in which the gate shutter 23 is lowered while being separated laterally of the partition wall 22 so as to widely open the opening 21.

The controller 4 controls, based on the details of the recipes held in the storage unit, the operations of the substrate rotation mechanism 12, the heater 13, the lift pin raising/lowering mechanism 18, the sacrificial polymer solution valve 19, the gate opening/closing mechanism 24 and the like included in the sacrificial film forming unit 7a.

The processing of the substrate W which is performed in the sacrificial film forming unit 7a will next be described.

The center robot CR carries the substrate W into the chamber 10 of the sacrificial film forming unit 7a. Before the substrate W is carried into the interior of the chamber 10, the gate opening/closing mechanism 24 is driven by the controller 4. In this way, the gate shutter 23 is arranged in the opening position so as to open the opening 21 of the chamber 10. The lift pin raising/lowering mechanism 18 is also driven by the controller 4 such that the tip ends of the lift pins 15 are protruded upward of the substrate holding base 8.

Thereafter, the center robot CR controlled by the controller 4 carries the substrate W into the chamber 10, and the substrate W is placed on the lift pins 15 in a state where a pattern formation surface (front surface) on which patterns are formed is directed upward. The controller 4 causes the center robot CR to place the substrate W on the lift pins 15 and then retracts the center robot CR from the interior of the chamber 10. Thereafter, the gate opening/closing mechanism 24 is driven by the controller 4 so as to arrange the gate shutter 23 in the closing position. In this way, the opening 21 of the chamber 10 is tightly closed by the gate shutter 23.

Next, the lift pin raising/lowering mechanism 18 is driven by the controller 4 such that the tip ends of the lift pins 15 are retracted downward of the substrate holding base 8. By the retraction of the lift pins 15, the substrate W on the lift pins 15 is transferred onto the substrate holding base 8. In this way, the substrate W is held on the substrate holding base 8 in the holding position P1 (substrate holding step). The substrate W is held on the substrate holding base 8, and thereafter the controller 4 controls the substrate rotation mechanism 12 so as to rotate the substrate W held on the substrate holding base 8.

Next, a sacrificial film formation step of supplying the sacrificial polymer solution to the substrate W so as to form a sacrificial film on at least the tip end portions of the patterns other than the base portions formed on the front surface of the substrate W is performed. Specifically, the controller 4 opens the sacrificial polymer solution valve 19 while rotating the substrate W by the substrate holding base 8, and thereby discharges the sacrificial polymer solution toward the center portion of the upper surface of the substrate W held on the substrate holding base 8.

The sacrificial film formation step will be described with reference to FIG. 2 and FIGS. 3A to 3D. The sacrificial film formation step includes a liquid film formation step, a liquid film holding step and a drying step.

The liquid film formation step is a step of holding, on the upper surface of the substrate W, a puddle-shaped liquid film 26 of a sacrificial polymer solution 25 which covers the upper surface. In the liquid film formation step, the controller 4 controls the substrate rotation mechanism 12 so as to keep the rotation of the substrate W at a puddle speed (0 to 100 rpm). The substrate W is rotated at the puddle speed, and thus a centrifugal force acting on the sacrificial polymer solution 25 supplied onto the substrate W is reduced, with the result that it is possible to suppress the sacrificial polymer solution 25 from being discharged from the upper surface of the substrate W. Then, the sacrificial polymer solution 25 is supplied to the entire region of an upper surface of the substrate W on which patterns P are formed, and thus the liquid film 26 which covers the front surface of the substrate W is formed (see FIG. 3A).

Here, the "puddle-shaped" refers to such a state where the substrate W is rotated at zero or low speed so as to make only a zero or low centrifugal force act on a liquid film of a liquid supplied to the upper surface of the substrate W and where thus the liquid stays on the upper surface of the substrate W so as to form the liquid film. The same is true in the following description of the specification. On the other hand, the "puddle speed" refers to such a speed that the centrifugal force acting on a liquid on the upper surface of the substrate W when the substrate W is rotated is lower than an interfacial tension acting between the liquid and the upper surface of the substrate W or the centrifugal force and the interfacial tension are substantially equal to each other. The same is true in the following description of the specification.

Next, the controller 4 controls the substrate rotation mechanism 12 so as to stop the rotation of the substrate W by the substrate holding base 8. Next, the controller 4 energizes the heater 13 so as to heat the substrate W to a temperature which is equal to or higher than the boiling point of the solvent contained in the sacrificial polymer solution 25. In this way, the solvent in the sacrificial polymer solution 25 in contact with the front surface of the substrate W is evaporated by the heat from the substrate W, and thus vapor is generated (see FIG. 3B). The generated vapor is interposed as layers between the front surface of the substrate W and the liquid film 26 so as to push up the liquid film 26 in the direction of the tip end portions of the patterns P as indicated by dot-dashed arrows in FIG. 3B due to a so-called Leidenfrost phenomenon (liquid film holding step). The sacrificial polymer solution 25 forming the liquid film 26 is concentrated by the evaporation of the solvent.

Next, as necessary, heating is further continued so as to dry the liquid film 26, and thus the sacrificial film is formed on at least the tip end portions of the patterns P other than the base portions. Specifically, a state where the tip end portions of the adjacent patterns P are connected by the bridge of a sacrificial film 27 (see FIG. 3C), a state where the tip end portions of the individual patterns are separately covered by sacrificial films 28 (see FIG. 3D) or a state where these states are mixed is achieved (drying step).

In any of those states, for example, in the spin drying step or the like after the subsequent processing liquid supply step, the collapse of the patterns P can be suppressed or prevented. In any of those states, as compared with a conventional sacrificial layer which completely fills gaps between patterns, the amount of sacrificial polymer used in the formation of the sacrificial film 27 or the sacrificial films 28 can be reduced, and thus it is possible to suppress a residue from being produced. Moreover, in any of those states, the base portions of the patterns P are exposed without being covered by the sacrificial film 27 or the sacrificial films 28. Hence, to the base portions of the patterns P which are exposed after the formation of the sacrificial film 27 or the sacrificial films 28, the processing liquid supply step and the spin drying step can be performed.

In order to form the sacrificial film 27 or the sacrificial films 28 by retaining the liquid film 26 of the sacrificial polymer solution 25 on at least the tip end portions of the patterns P other than the base portions as in the examples of these figures, a solid content concentration (the concentration of the sacrificial polymer) of the sacrificial polymer solution 25, a thickness of the liquid film 26 in the liquid film formation step, a temperature for heating the substrate W in the liquid film holding step and the like are preferably adjusted as necessary. Although as an example, the following test was performed, the arrangement of the present invention is not limited to this example.

A commercially available sacrificial polymer solution which is for the formation of a sacrificial layer and whose solid content concentration was about 5 to 10 mass % was diluted with IPA to a ratio of 1:10000, and thus a sacrificial polymer solution whose solid content concentration was 5 to 10 ppm was prepared. When in a state where the sacrificial polymer solution was puddle-coated on the surface of a chip in which patterns formed of Si and amorphous carbon (a-C) with an aspect ratio AR of 15 (a width of 30 nm, a height of 450 nm) were formed, the chip was placed on a hotplate of 120° C., the sacrificial polymer solution was dried in about 3 seconds. When the cross section of the dried chip was observed with a SEM (Scanning Electron Microscope), it was confirmed that a sacrificial film was selectively formed on at least the tip end portions of the patterns other than base portions.

As a result of the test, it is estimated that when the sacrificial polymer solution is spin-coated on the same chip, the solid content concentration thereof is preferably set to about 0.5 to 1 mass %.

With reference to FIG. 2, after the formation of the sacrificial film, the lift pin raising/lowering mechanism 18 is driven by the controller 4. In this way, the lift pins 15 are raised up to a position (for example, a position in which the substrate W can be exchanged with the center robot CR) in which the substrate W is separated upward with respect to the substrate holding base 8. Then, the gate opening/closing mechanism 24 is driven by the controller 4 such that the gate shutter 23 is arranged in the opening position. In this way, the opening 21 of the chamber 10 is opened. Thereafter, the substrate W supported by the lift pins 15 is carried out from the interior of the chamber 10 by the center robot CR.

Figure 4:
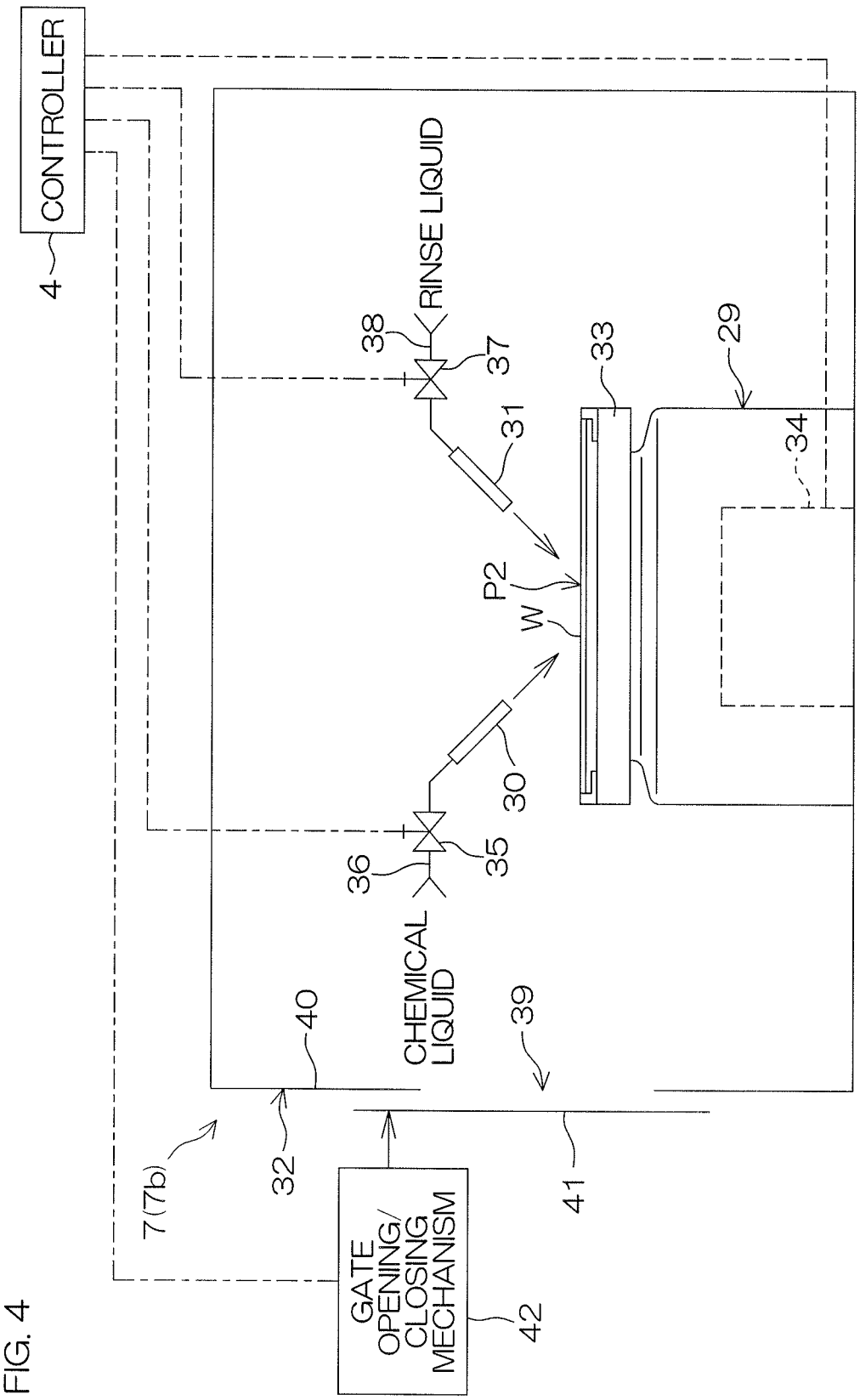
FIG. 4 is a schematic view showing a schematic arrangement of a liquid processing unit included in the substrate processing apparatus.

FIG. 4 is a schematic view showing a schematic arrangement of the liquid processing unit 7b included in the substrate processing apparatus 1. In the following discussion, the schematic arrangement of the liquid processing unit 7b and an example of the processing of the substrate W which is performed in the liquid processing unit 7b will be described. The schematic arrangement of the liquid processing unit 7b will first be described.

The liquid processing unit 7b includes a spin chuck (substrate holding unit) which holds the substrate W horizontally and rotates it, a chemical liquid nozzle 30 which supplies a chemical liquid to the upper surface of the substrate W held by the spin chuck 29, a rinse liquid nozzle 31 which supplies a rinse liquid to the upper surface of the substrate W held by the spin chuck 29 and a chamber 32 which stores the spin chuck 29, the chemical liquid nozzle 30 and the rinse liquid nozzle 31.

The spin chuck 29 includes a disk-shaped spin base 33 which can be rotated about a vertical axis passing through the center of the substrate W and a spin motor 34 (rotation unit) which rotates the spin base 33 about the vertical axis. The spin chuck 29 may be a clamping type chuck which clamps the substrate W in the horizontal direction so as to hold the substrate W horizontally or may be a vacuum-suction type chuck which sucks the rear surface (lower surface) of the substrate W which is a non-device formation surface so as to hold the substrate W horizontally. In the preferred embodiment, the spin chuck 29 is a clamping type chuck. The spin chuck 29 holds the substrate W horizontally in a holding position P2. The holding position P2 is a liquid processing position.

The chemical liquid nozzle 30 is connected to a chemical liquid supply pipe 36 (processing liquid supply unit) in which a chemical liquid valve 35 is interposed. The supply of the chemical liquid to the chemical liquid nozzle 30 is controlled by the opening and closing of the chemical liquid valve 35. The chemical liquid supplied to the chemical liquid nozzle 30 is discharged toward the center portion of the upper surface of the substrate W held by the spin chuck 29.

As the chemical liquid, an etching liquid and a washing liquid are mentioned. More specifically, examples of the chemical liquid include hydrofluoric acid, SC1 (mixed liquid of ammonia and hydrogen peroxide solution), SC2 (mixed liquid of hydrochloric acid and hydrogen peroxide solution), ammonium fluoride, buffered hydrofluoric acid (mixed liquid of hydrofluoric acid and ammonium fluoride).

The rinse liquid nozzle 31 is connected to a rinse liquid supply pipe 38 (processing liquid supply unit) in which a rinse liquid valve 37 is interposed. The supply of the rinse liquid to the rinse liquid nozzle 31 is controlled by the opening and closing of the rinse liquid valve 37. The rinse liquid supplied to the rinse liquid nozzle 31 is discharged toward the center portion of the upper surface of the substrate W held by the spin chuck 29.

Examples of the rinse liquid include pure water (deionized water), carbonated water, electrolytic ion water, hydrogen water, ozone water and aqueous hydrochloric acid solution of dilute concentration (for example, about 10 to 100 ppm).

The chamber 32 includes a partition wall 40 in which an opening 39 for carrying the substrate W into and out of the chamber 32 is formed and a gate shutter 41 which covers the opening 39. The gate shutter 41 is arranged outside the partition wall 40. A gate opening/closing mechanism 42 including a cylinder is coupled to the gate shutter 41. The gate opening/closing mechanism 42 moves the gate shutter 41 between a closing position in which the gate shutter 41 is closely adhered to the outer surface of the partition wall 40 so as to tightly close the opening 39 and an opening position in which the gate shutter 41 is lowered while being separated laterally of the partition wall 40 so as to widely open the opening 39.

The controller 4 controls, based on the details of the recipes held in the storage unit, the operations of the spin motor 34, the chemical liquid valve 35, the rinse liquid valve 37, the gate opening/closing mechanism 42 and the like included in the liquid processing unit 7b.

The processing of the substrate W which is performed in the liquid processing unit 7b will next be described.

The center robot CR carries, into the chamber 32 of the liquid processing unit 7b, the substrate W on which the sacrificial film has been formed in the sacrificial film forming unit 7a. Before the substrate W is carried into the interior of the chamber 32, the gate opening/closing mechanism 42 is driven by the controller 4. In this way, the gate shutter 41 is arranged in the opening position, and thus the opening 39 of the chamber 32 is opened. Thereafter, the center robot CR controlled by the controller 4 carries the substrate W into the chamber 32 and places the substrate W on the spin chuck 29 in a state where its pattern formation surface (front surface) is directed upward. Then, the substrate W is held by the spin chuck 29 such that the substrate W can be rotated together with the spin base 33.

The controller 4 causes the center robot CR to place the substrate W on the spin chuck 29, and then retracts the center robot CR from the interior of the chamber 32. Thereafter, the gate opening/closing mechanism 42 is driven by the controller 4 such that the gate shutter 41 is arranged in the closing position. In this way, the opening 39 of the chamber 32 is tightly closed by the gate shutter 41. The opening 39 of the chamber 32 is tightly closed, and then the controller 4 controls the spin motor 34 so as to rotate the substrate W held by the spin chuck 29.

Next, the processing liquid supply step of supplying the processing liquid to the front surface of the substrate W so as to process the substrate W is performed.

Chemical liquid processing which supplies the chemical liquid to the substrate W so as to process the substrate W is first performed. By the chemical liquid processing, an oxide film, a nitride film, an etching residue and the like on the front surface of the substrate W and the patterns are removed. Specifically, the controller 4 opens the chemical liquid valve 35 so as to discharge, from the chemical liquid nozzle 30, the chemical liquid toward the center portion of the upper surface of the substrate W held by the spin chuck 29 while rotating the substrate W by the spin chuck 29. The chemical liquid discharged from the chemical liquid nozzle 30 is supplied to the center portion of the upper surface of the substrate W and receives a centrifugal force produced by the rotation of the substrate W so as to be spread outward along the upper surface of the substrate W. In this way, the chemical liquid is supplied to the entire region of the upper surface of the substrate W so as to process the entire region of the upper surface of the substrate W. Then, when a predetermined time elapses after the opening of the chemical liquid valve 35, the controller 4 closes the chemical liquid valve 35 so as to stop the discharge of the chemical liquid from the chemical liquid nozzle 30.

Next, rinse processing which supplies the rinse liquid to the substrate W so as to wash away the chemical liquid adhered to the substrate W is performed. Specifically, the controller 4 opens the rinse liquid valve 37 so as to discharge, from the rinse liquid nozzle 31, the rinse liquid toward the center portion of the upper surface of the substrate W held by the spin chuck 29 while rotating the substrate W by the spin chuck 29. The rinse liquid discharged from the rinse liquid nozzle 31 is supplied to the center portion of the upper surface of the substrate W and receives the centrifugal force produced by the rotation of the substrate W so as to be spread outward along the upper surface of the substrate W. In this way, the rinse liquid is supplied to the entire region of the upper surface of the substrate W so as to wash away the chemical liquid adhered to the substrate W. Then, when a predetermined time elapses after the opening of the rinse liquid valve 37, the controller 4 closes the rinse liquid valve 37 so as to stop the discharge of the rinse liquid from the rinse liquid nozzle 31.

Next, the spin drying step of drying the substrate W is performed. Specifically, the controller 4 controls the spin motor 34 so as to rotate the substrate W at a high rotational speed (for example, several thousands of rpm). In this way, a large centrifugal force acts on the rinse liquid adhered to the substrate W, and thus the rinse liquid is spun off to the surrounding of the substrate W. Thus, the rinse liquid is removed from the substrate W such that the substrate W is dried. After the spin drying step is performed for a predetermined time, the controller 4 controls the spin motor 34 so as to stop the rotation of the substrate W by the spin chuck 29. Thereafter, the gate opening/closing mechanism 42 is driven by the controller 4 so as to arrange the gate shutter 41 in the opening position. In this way, the opening 39 of the chamber 32 is opened. Thereafter, the substrate W held by the spin chuck 29 is carried out from the interior of the chamber 32 by the center robot CR.

Figure 5:
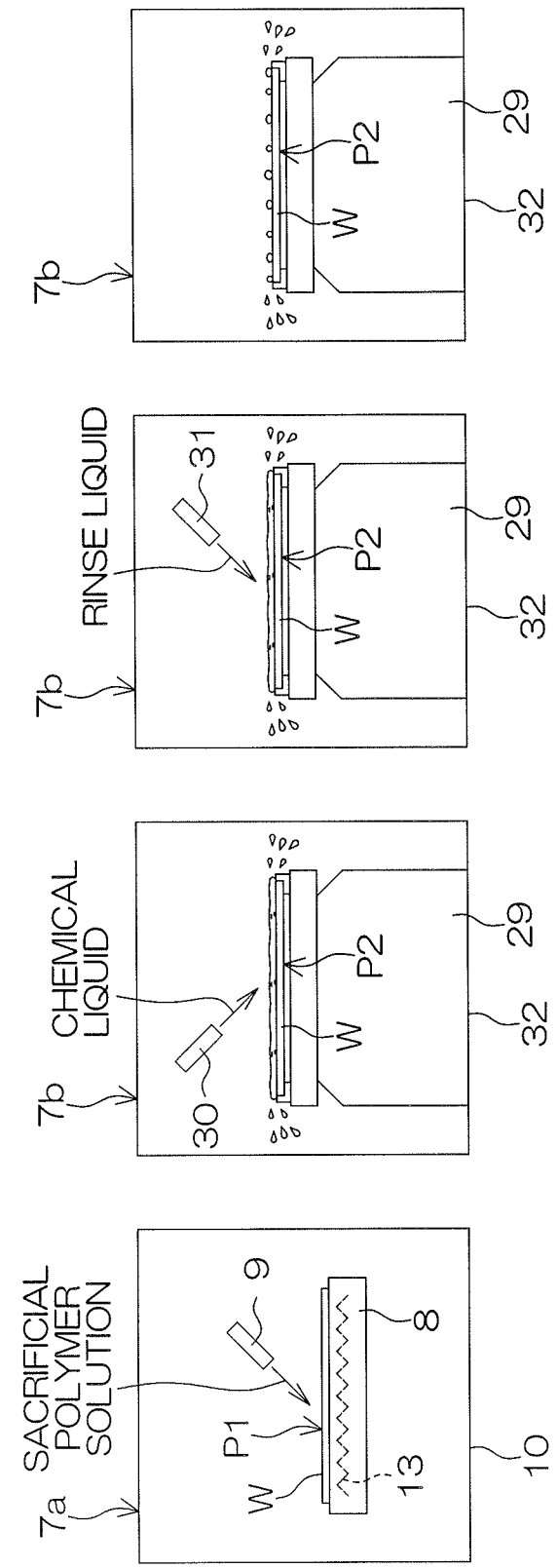
FIG. 5 is a diagram for illustrating an example of the processing of a substrate which is performed by the substrate processing apparatus.

FIG. 5 is a diagram for illustrating an example of the processing of the substrate W which is performed by the substrate processing apparatus 1. A description will be given below with reference to FIGS. 1 and 5.

The unprocessed substrate W which is stored within the carrier C held by the carrier holding portion 5 is carried out by the indexer robot IR. Then, the substrate W carried out from the interior of the carrier C is passed from the indexer robot IR to the center robot CR. The center robot CR carries the unprocessed substrate W received from the indexer robot IR into the interior of the chamber 10 of the sacrificial film forming unit 7a, and places the substrate W in the holding position P1 on the substrate holding base 8 (substrate holding step).

As shown in FIG. 5(a), in the sacrificial film forming unit 7a, as described previously, the sacrificial film is selectively formed on at least the tip end portions other than the base portions of the patterns formed on the front surface of the substrate W (sacrificial film formation step). Specifically, the sacrificial polymer solution is supplied from the sacrificial polymer solution nozzle 9 to the front surface of the substrate W held in the holding position P1 on the substrate holding base 8 so as to form a liquid film which covers the front surface of the substrate W (liquid film formation step). Then, the heater 13 is energized so as to heat the substrate W to the temperature which is equal to or higher than the boiling point of the solvent contained in the sacrificial polymer solution. In this way, by the mechanism described previously, the solvent in the sacrificial polymer solution in contact with the front surface of the substrate W is evaporated, and vapor thus generated pushes up the liquid film in the direction of the tip end portions of the patterns (liquid film holding step). Then, the liquid film pushed up is dried, and thus the sacrificial film is selectively formed on at least the tip end portions other than the base portions of the patterns (drying step).

Then, after the sacrificial film is selectively formed on at least the tip end portions other than the base portions of the patterns, the substrate W arranged within the chamber 10 of the sacrificial film forming unit 7a is carried out from the interior of the chamber 10 by the center robot CR. The substrate W carried out from the interior of the chamber 10 of the sacrificial film forming unit 7a is carried into the interior of the chamber 32 of the liquid processing unit 7b by the center robot CR.

As described previously, the base portions of the patterns are exposed without being covered by the sacrificial film. Hence, after the formation of the sacrificial film, in the liquid processing unit 7b, to the base portions of the patterns, the processing liquid supply step and the spin drying step can be performed.

As shown in FIG. 5(b), in the liquid processing unit 7b, as described previously, the chemical liquid is supplied from the chemical liquid nozzle 30 to the front surface of the substrate W held by the spin chuck 29 in the holding position P2. In this way, the substrate W is processed by the chemical liquid (chemical liquid processing). Thereafter, as shown in FIG. 5 (c), the rinse liquid is supplied from the rinse liquid nozzle 31 to the front surface of the substrate W held by the spin chuck 29 in the holding position P2 so as to wash away the chemical liquid adhered to the front surface of the substrate W (rinse processing). Then, as shown in FIG. 5(d), by the high-speed rotation of the substrate W, the rinse liquid adhered to the substrate W is removed from the substrate W (spin drying step). In this way, a series of processing steps in the substrate processing apparatus 1 are completed. The controller 4 performs the control such that these operations are repeatedly performed so as to process a plurality of substrates W one by one.

The substrate W in which the processing is completed is transferred to an external device, and the sacrificial film can be removed by processing such as ashing or dry etching.

As described above, in the first preferred embodiment, the liquid film 26 covering the front surface of the substrate W is heated from the side of the substrate W, and thus by the so-called Leidenfrost phenomenon, the substrate W can be dried in a state where the liquid film 26 is held on at least the tip end portions other than the base portions of the patterns P. In other words, in particular, the region including at least the tip end portions which are easily brought into contact with each other in the patterns P formed on the front surface of the substrate W can be selectively covered by the sacrificial film 27 or the sacrificial films 28 formed of a small amount of sacrificial polymer as compared with the conventional method.

Moreover, in a state where the sacrificial film 27 or the sacrificial films 28 are previously formed on at least the tip end portions other than the base portions of the patterns P, the processing liquid supply step and the spin drying step are performed. The base portions of the patterns P are exposed without being covered by the sacrificial film 27 or the sacrificial films 28. Hence, while in the spin drying step, the collapse of the patterns P is suppressed or prevented by the sacrificial film 27 or the sacrificial films 28, in the processing liquid supply step before the spin drying step, the base portions of the patterns P which are exposed without being covered by the sacrificial film 27 or the sacrificial films 28 can be processed with the processing liquid.

Although in the first preferred embodiment, the case where the liquid processing unit 7b and the sacrificial film forming unit 7a are separate from each other is described, the liquid processing unit 7b and the sacrificial film forming unit 7a may be integrated into one processing unit 7c. In such a case, the sacrificial film formation position (holding position P1) and the liquid processing position (holding position P2) are set to the same position.

Figure 6:
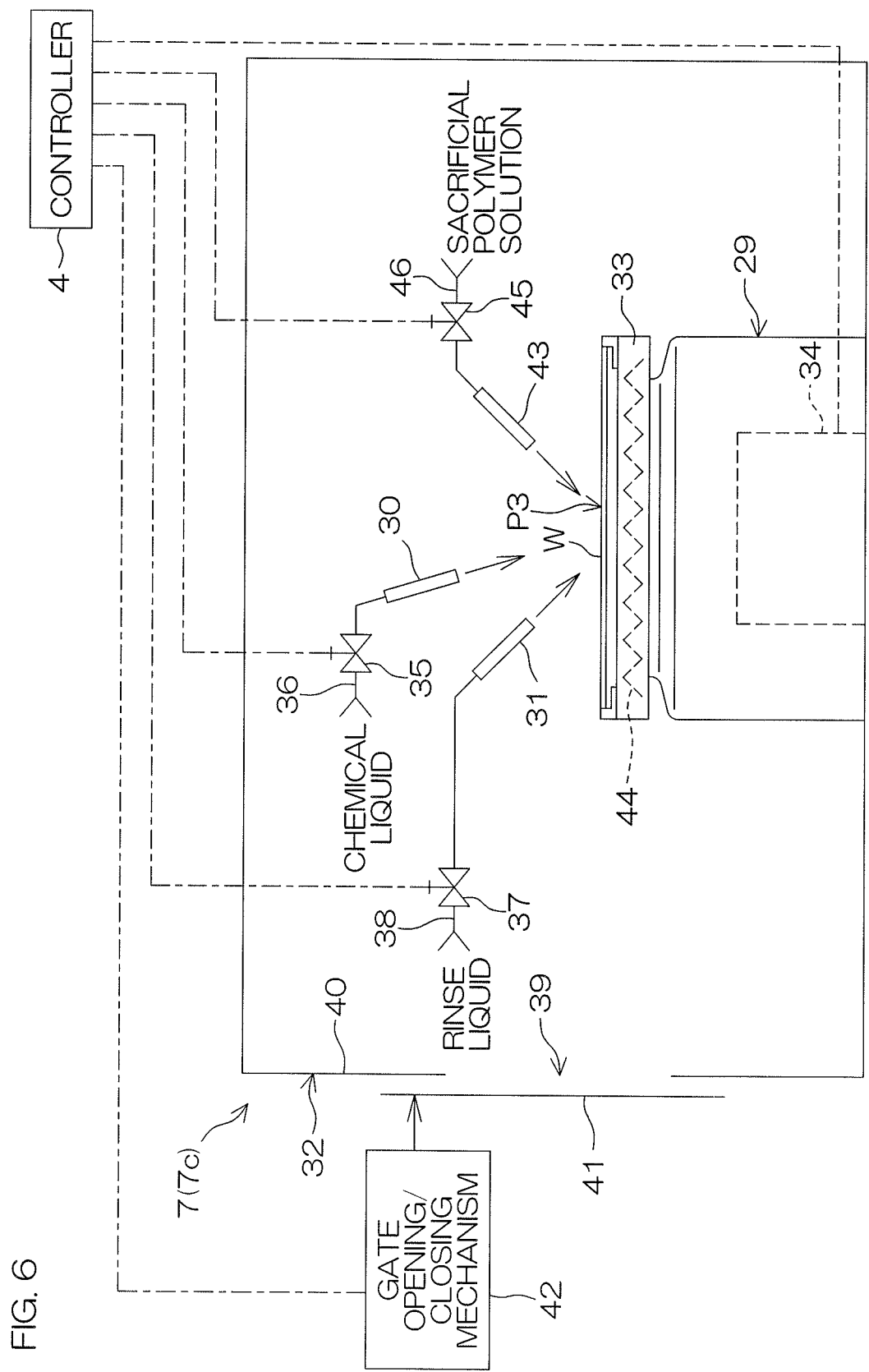
FIG. 6 is a schematic view showing a schematic arrangement of a variation of a processing unit included in the substrate processing apparatus.

FIG. 6 is a schematic view showing a schematic arrangement of the processing unit 7c in a variation. In the processing unit 7c of the variation, a mechanism which forms the sacrificial film is added to the liquid processing unit 7b of FIG. 4 described previously. Hence, in FIG. 6, constituent portions which are equivalent to the individual portions shown in FIG. 4 described previously are identified with reference signs equivalent to those in FIG. 4, and the description thereof will be omitted.

In the following discussion, the schematic arrangement of the processing unit 7c and an example of the processing of the substrate W which is performed in the processing unit 7c will be described. The schematic arrangement of the processing unit 7c will first be described.

In addition to the spin chuck 29 (substrate holding unit), the chemical liquid nozzle 30 and the rinse liquid nozzle 31, the processing unit 7c includes, within the chamber 32, a sacrificial polymer solution nozzle 43 which supplies a sacrificial polymer solution to the upper surface of the substrate W held by the spin chuck 29. The spin chuck 29 holds the substrate W horizontally in a holding position P3. The holding position P3 also serves as the sacrificial film formation position and the liquid processing position. Within a spin base 33, a heater 44 (heating unit) which heats the substrate W held by the spin chuck 29 is embedded.

The sacrificial polymer solution nozzle 43 is connected to a sacrificial polymer solution supply pipe 46 (sacrificial polymer solution supply unit) in which a sacrificial polymer solution valve 45 is interposed. The supply of the sacrificial polymer solution to the sacrificial polymer solution nozzle 43 is controlled by the opening and closing of the sacrificial polymer solution valve 45. The sacrificial polymer solution supplied to the sacrificial polymer solution nozzle 43 is discharged toward the center portion of the upper surface of the substrate W held by the spin chuck 29. As the sacrificial polymer solution, the sacrificial polymer solution described previously can be used.

As a chemical liquid discharged from the chemical liquid nozzle 30 and a rinse liquid discharged from the rinse liquid nozzle 31, the chemical liquid and the rinse liquid described previously can also be respectively used.

The controller 4 controls, based on the details of the recipes held in the storage unit, the operations of a spin motor 34, the heater 44, the sacrificial polymer solution valve 45, a chemical liquid valve 35, a rinse liquid valve 37, a gate opening/closing mechanism 42 and the like included in the processing unit 7c.

The processing of the substrate W which is performed in the processing unit 7c will next be described.

By the same procedure as in the liquid processing unit 7b of FIG. 4, the gate opening/closing mechanism 42 is driven by the controller 4, and thus a gate shutter 41 is arranged in an opening position, with the result that the opening 39 of the chamber 32 is opened. Next, the center robot CR controlled by the controller 4 carries the substrate W into the chamber 32 and places the substrate W on the spin chuck 29 in a state where its pattern formation surface (front surface) is directed upward. Then, the substrate W is held by the spin chuck 29 such that the substrate W can be rotated together with the spin base 33.

Next, after the center robot CR is retracted from the interior of the chamber 32, the gate opening/closing mechanism 42 is driven by the controller 4, and thus the gate shutter 41 is arranged in a closing position, with the result that the opening 39 of the chamber 32 is tightly closed by the gate shutter 41.

Thereafter, the controller 4 controls the spin motor 34 so as to rotate the substrate W held by the spin chuck 29 at the puddle speed described previously. Next, while the controller 4 is rotating the substrate W at the puddle speed, the controller 4 opens the sacrificial polymer solution valve 45 so as to discharge, from the sacrificial polymer solution nozzle 43, the sacrificial polymer solution toward the center portion of the upper surface of the substrate W held by the spin chuck 29. In this way, on the front surface of the substrate W, the liquid film of the sacrificial polymer solution is formed.

Next, the controller 4 controls the spin motor 34 so as to stop the rotation of the substrate W by the spin chuck 29. Then, the controller 4 energizes the heater 44 so as to heat the substrate W to the temperature which is equal to or higher than the boiling point of the solvent contained in the sacrificial polymer solution. In this way, by the mechanism described previously, the sacrificial film is selectively formed on at least the tip end portions other than the base portions of the patterns on the front surface of the substrate W (sacrificial film formation step).

Next, the controller 4 controls the spin motor 34 so as to perform the processing liquid supply step of processing the substrate W by supplying the processing liquid to the front surface of the substrate W while rotating again the substrate W held by the spin chuck 29. Specifically, the chemical liquid valve 35 is first opened for a predetermined time, and thus the chemical liquid is discharged from the chemical liquid nozzle 30 toward the center portion of the upper surface of the substrate W held by the spin chuck 29, with the result that chemical liquid processing is performed. Next, the rinse liquid valve 37 is opened for a predetermined time, and thus the rinse liquid is discharged from the rinse liquid nozzle 31 toward the center portion of the upper surface of the substrate W held by the spin chuck 29, with the result that rinse liquid processing is performed.

Next, the controller 4 controls the spin motor 34 so as to rotate the substrate W at a high rotational speed (for example, several thousands of rpm). In this way, a large centrifugal force acts on the rinse liquid adhered to the substrate W, and thus the rinse liquid is spun off to the surrounding of the substrate W. Thus, the rinse liquid is removed from the substrate W such that the substrate W is dried (drying step).

After the spin drying step is performed for a predetermined time, the controller 4 controls the spin motor 34 so as to stop the rotation of the substrate W by the spin chuck 29. Thereafter, the gate opening/closing mechanism 42 is driven by the controller 4 so as to arrange the gate shutter 41 in the opening position, and thus the opening 39 of the chamber 32 is opened. Then, the substrate W held by the spin chuck 29 is carried out from the interior of the chamber 32 by the center robot CR.

The substrate Win which the processing is completed is transferred to an external device, and the sacrificial film can be removed by processing such as ashing or dry etching.

In the variation described above, within the one processing unit 7c, the steps from the sacrificial film formation step to the spin drying step can be performed consistently.

Although the one preferred embodiment of this invention and embodiment of FIG. 6 which is the variation thereof are described above, this invention can be practiced in other embodiments.

For example, in the preferred embodiment and the variation described above, the liquid film is formed on the front surface of the substrate in the liquid film formation step, and thereafter the substrate is heated such that the liquid film holding step is performed. However, the sacrificial polymer solution may be previously supplied to the front surface of the substrate which has been heated such that the liquid film formation step and the liquid film holding formation step are performed substantially simultaneously.

Although in the description of the preferred embodiment and the variation discussed above, the substrate is rotated at the puddle speed in the liquid film formation step, the substrate may be rotated at a liquid processing speed (at such a rotational speed that a large centrifugal force acts on the substrate) which exceeds the puddle speed.

When the puddle speed is set to zero, the arrangement of the substrate rotation mechanism 12 in the sacrificial film forming unit 7a can be omitted.

In the preferred embodiment and the variation described above, successively after the liquid film holding step, the substrate continues to be heated, with the result that the drying step is performed. However, in the drying step, the liquid film may be dried by stopping the heating and using only the remaining heat of the liquid film holding step.

In the preferred embodiment and the variation described above, by the sacrificial film formation method according to this invention, the sacrificial film formed on at least the tip end portions other than the base portions of the patterns is utilized in the drying step after the liquid processing using the processing liquid in order to prevent the collapse of the patterns. However, instead of the conventional sacrificial layer which completely fills gaps between patterns, the sacrificial film can be utilized in order to protect the patterns, for example, when the substrate W is transferred. In such a case, the amount of sacrificial polymer used is reduced as compared with the conventional method, and thus it is possible to suppress the production of a residue to a minimum.

Although in the preferred embodiment and the variation described above, the case where the substrate processing apparatus 1 is an apparatus which processes the disk-shaped substrates is described, the substrate processing apparatus 1 may be an apparatus which processes polygonal substrates.

Although the preferred embodiment of the present invention has been described in detail, the preferred embodiment is merely a specific example which is used to clarify the technical content of the present invention. The present invention should not be interpreted as being limited to the specific example, and the scope of the present invention is limited only by the scope of claims which is attached.

The present application corresponds to Japanese Patent Application No. 2016-177884 filed with Japan Patent Office on Sep. 12, 2016, and the entre disclosure of the present application is incorporated herein by reference.

REFERENCE SIGNS LIST

1 Substrate processing apparatus
4 Controller
7a Sacrificial film forming unit
7b Liquid processing unit
7c Processing unit
8 Substrate holding base (substrate holding unit)
12 Substrate rotation mechanism (rotation unit)
13, 44 Heater (heating unit)
20, 46 Sacrificial polymer solution supply pipe (sacrificial polymer solution supply unit)
25 Sacrificial polymer solution
26 Liquid film
27, 28 Sacrificial film
29 Spin chuck (substrate holding unit)
34 Spin motor (rotation unit)
36 Chemical liquid supply pipe (processing liquid supply unit)
38 Rinse Liquid supply pipe (processing liquid supply unit)
P Pattern
P1 Holding Position (sacrificial film formation position)
P2 Holding Position (liquid processing position)
P3 Holding Position (liquid processing position+sacrificial film formation position)
W Substrate

The invention claimed is:

1. A sacrificial film formation method comprising:
a substrate holding step of horizontally holding the substrate having a pattern formed on a front surface in a state where the front surface is directed upward;
a liquid film formation step of supplying a solution of a sacrificial polymer to the front surface of the substrate so as to form a liquid film which covers and directly contacts the front surface of the substrate;
a liquid film holding step of heating the substrate so as to evaporate the solution in contact with the front surface of the substrate such that the liquid film is held on at least a tip end portion other than a base portion of the pattern; and
a drying step of forming the sacrificial film on at least the tip end portion other than the base portion of the pattern formed on the front surface of the substrate while the base portion of the pattern is exposed without being covered by the sacrificial film, by drying the liquid film which is held.

2. The sacrificial film formation method according to claim 1,
wherein the drying step includes a step of heating the substrate.

3. A substrate processing method comprising:
a sacrificial film formation step which uses the substrate holding step, the liquid film formation step, the liquid film holding step, and the drying step of the sacrificial film formation method according to claim 1 so as to form a sacrificial film on at least a tip end portion other than a base portion of a pattern formed on a front surface of the substrate while the base portion of the pattern is exposed without being covered by the sacrificial film, a processing liquid supply step of supplying a processing liquid to the front surface of the substrate in which the sacrificial film was formed, a spin drying step of rotating, after the processing liquid supply step, the substrate so as to perform spinning-off drying.

4. The substrate processing method according to claim 3, wherein the drying step includes a step of heating the substrate.

5. A sacrificial film formation method comprising:

a substrate holding step of horizontally holding the substrate having a pattern formed on a front surface in a state where the front surface is directed upward;

a liquid film formation step of supplying a solution of a sacrificial polymer to the front surface of the substrate so as to form a liquid film which covers and directly contacts the front surface of the substrate;

a liquid film holding step of heating the substrate so as to evaporate the solution in contact with the front surface of the substrate to generate vapor, and push up the liquid film with the generated vapor, such that the liquid film is held on at least a tip end portion other than a base portion of the pattern; and a drying step of forming the sacrificial film on at least the tip end portion other than the base portion of the pattern formed on the front surface of the substrate, by drying the liquid film which is held.

6. The sacrificial film formation method according to claim 5, wherein the drying step includes a step of heating the substrate.

7. A substrate processing method comprising:

a sacrificial film formation step which uses the substrate holding step, the liquid film formation step, the liquid film holding step, and the drying step of the sacrificial film formation method according to claim 5 so as to form a sacrificial film on at least a tip end portion other than a base portion of a pattern formed on a front surface of the substrate, a processing liquid supply step of supplying a processing liquid to the front surface of the substrate in which the sacrificial film was formed, a spin drying step of rotating, after the processing liquid supply step, the substrate so as to perform spinning-off drying.

8. The substrate processing method according to claim 7, wherein the drying step includes a step of heating the substrate.

* * * * *